United States Patent
Zhang et al.

(10) Patent No.: US 11,237,239 B2
(45) Date of Patent: Feb. 1, 2022

(54) MAGNETIC RESONANCE CEST IMAGING SEQUENCE AND DEVICE BASED ON FREQUENCY STABILIZATION MODULE

(71) Applicant: ZHEJIANG UNIVERSITY, Hangzhou (CN)

(72) Inventors: Yi Zhang, Hangzhou (CN); Ruibin Liu, Hangzhou (CN); Hongxi Zhang, Hangzhou (CN); Dan Wu, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 16/762,917

(22) PCT Filed: Sep. 3, 2019

(86) PCT No.: PCT/CN2019/104183
§ 371 (c)(1),
(2) Date: May 9, 2020

(87) PCT Pub. No.: WO2020/078131
PCT Pub. Date: Apr. 23, 2020

(65) Prior Publication Data
US 2021/0373100 A1    Dec. 2, 2021

(30) Foreign Application Priority Data
Oct. 17, 2018    (CN) .......................... 201811210428.3

(51) Int. Cl.
*G01R 33/485* (2006.01)
*G01R 33/54* (2006.01)
(Continued)

(52) U.S. Cl.
CPC ......... *G01R 33/485* (2013.01); *G01R 33/543* (2013.01); *G01R 33/5605* (2013.01); *G01R 33/56563* (2013.01)

(58) Field of Classification Search
CPC .................. G01R 33/485; G01R 33/5605; G01R 33/543; G01R 33/56563; G01R 33/4828
See application file for complete search history.

(56) References Cited

U.S. PATENT DOCUMENTS

| | | | |
|---|---|---|---|
| 2006/0164083 A1 * | 7/2006 | Harvey | G01R 33/389 324/307 |
| 2009/0256567 A1 | 10/2009 | Aksit et al. | |
| 2014/0117987 A1 * | 5/2014 | Yui | G01R 33/28 324/309 |

FOREIGN PATENT DOCUMENTS

| CN | 1816754 A | 8/2006 |
|---|---|---|
| CN | 101357063 A | 2/2009 |

(Continued)

OTHER PUBLICATIONS

International Search Report (PCT/CN2019/104183); dated Dec. 9, 2019.

(Continued)

*Primary Examiner* — Rishi R Patel
(74) *Attorney, Agent, or Firm* — W&G Law Group

(57) ABSTRACT

A magnetic resonance CEST imaging sequence and device based on a frequency stabilization module are provided. It includes following steps: first, in the frequency stabilization module, exciting a target slice with a small-flip-angle radio frequency pulse, and collecting three lines of non-phase-encoded k-space data; second, obtaining an estimated value of the frequency drift of the main magnetic field by calculating the phase difference between the three lines of non-phase encoded k-space data; third, adjusting a center frequency of the radio frequency pulse based on the calculation (Continued)

result of the frequency drift of the main magnetic field, to realize a real-time correction of the frequency drift of the main magnetic field; and fourth, performing conventional magnetic resonance CEST imaging.

4 Claims, 3 Drawing Sheets

(51) Int. Cl.
   *G01R 33/565* (2006.01)
   *G01R 33/56* (2006.01)

(56) References Cited

FOREIGN PATENT DOCUMENTS

| CN | 102697501 A | 10/2012 |
| CN | 1378817 A | 11/2012 |
| CN | 109521383 | 8/2019 |
| JP | 2007526787 A | 9/2007 |
| JP | 2015016333 A | 1/2015 |
| JP | 2015512317 A | 4/2015 |
| WO | 9530908 A | 11/1995 |
| WO | 2014199879 A | 12/2014 |

OTHER PUBLICATIONS

"Real-Time Rf Pulse Adjustment for B0 Drift Correction, Magnetic Resonance in Medicine" Thomas Benner et al. [2006] vol. 56 pp. 204-209.
First Office Action (2020-522811) dated May 10, 2021.

* cited by examiner

MAGNETIC RESONANCE CEST IMAGING SEQUENCE AND DEVICE BASED ON FREQUENCY STABILIZATION MODULE

CROSS-REFERENCE TO RELATED APPLICATIONS

This application is a national stage of International Application No. PCT/CN2109/104183, filed on Sep. 3, 2019, which claims priority to Chinese Patent Application No. 201811210428.3, filed on Oct. 17, 2018. Both of the aforementioned applications are hereby incorporated by reference in their entireties.

TECHNICAL FIELD

The present disclosure relates to the field of magnetic resonance technology, and in particular, to the field of a correction of a frequency shift in the magnetic resonance CEST imaging.

BACKGROUND

Magnetic resonance CEST (Chemical Exchange Saturation Transfer) imaging is an important molecular magnetic resonance imaging technology and can detect free proteins and peptides in endogenous cytoplasm in a living body. The magnetic resonance CEST imaging is also used for tumor detection and tumor classification since it can obtain information on overexpressed proteins and peptides in the glioma. However, the magnetic resonance CEST imaging is very sensitive to the frequency drift of the main magnetic field, so that if the frequency drift of the main magnetic field is not corrected, it will greatly affect the performance of the magnetic resonance CEST imaging. Based on the interference of the frequency drift of the main magnetic field on the performance of the magnetic resonance CEST imaging, some researchers have proposed a method to correct the frequency drift of the main magnetic field in data post-processing. Although the data post-processing method can well correct the field frequency of the main magnetic field, it cannot guarantee effective suppression on fat signals, thereby causing excessively high fat signals to easily corrupt normal tissue signals in CEST images. In addition, a magnetic resonance CEST imaging sequence based on a frequency stabilization module can not only correct the frequency drift of the main magnetic field in real time but can also effectively suppress the fat signals, thereby improving the performance of the magnetic resonance CEST imaging.

SUMMARY

An object of the present disclosure is to provide a magnetic resonance CEST imaging sequence based on a frequency stabilization module, to achieve the real-time correction of the frequency drift of the main magnetic field and ensure effective suppression on the fat signals, so as to improve the performance of the magnetic resonance CEST imaging.

In order to achieve the above object, the present disclosure is implemented by using following technical solutions.

A magnetic resonance CEST imaging sequence based on a frequency stabilization module, includes following steps:

Step 1: in the frequency stabilization module, exciting a target slice with a radio frequency pulse having a flip angle smaller than 90°, and collecting three lines of non-phase-encoded k-space data at three different moments $t_1$, $t_2$, and $t_3$, respectively, where $t_2-t_1 < t_3-t_2 < 2(t_2-t_1)$;

Step 2: obtaining a fine estimated value of a main magnetic field frequency drift by calculating a phase difference between a first line of non-phase-encoded k-space data and a second line of non-phase encoded k-space data;

Step 3: obtaining a coarse estimated value of the main magnetic field frequency drift by calculating a difference between a phase difference between the second line of non-phase encoded k-space data and a third line of non-phase encoded k-space data and the phase difference between the first line of non-phase-encoded k-space data and the second line of non-phase encoded k-space data;

Step 4: comparing a difference between the coarse estimated value and the fine estimated value with a threshold, and if the difference between the coarse estimated value and the fine estimated value is smaller than the threshold, then selecting the fine estimated value as a value of the main magnetic field frequency drift; otherwise, selecting the coarse estimated value as the value of the main magnetic field frequency drift;

Step 5: adjusting a center frequency of the radio frequency pulse based on the value of the main magnetic field frequency drift, and then performing magnetic resonance CEST imaging based on the adjusted center frequency of the radio frequency pulse.

Further improvement of the present disclosure lies in that in the Step 2, the fine estimated value is calculated by:

first, averaging phase differences between individual data sampling points in the first line of non-phase-encoded k-space data and individual data sampling points in the second line of non-phase-encoded k-space data to obtain the phase difference between the first line of non-phase-encoded k-space data and the second line of non-phase-encoded k-space data, and then calculating the fine estimated value $\Delta f_{fine}$ of the main magnetic field frequency drift based on a relationship between a phase and a frequency, and a calculation process is based on:

$$\Delta f_{fine} = \frac{\overline{\varphi}_{2-1}}{2\pi \cdot \Delta TE_{2-1}},$$

where $\Delta TE_{2-1}$ is an interval between the moments $t_1$ and $t_2$, and $\overline{\varphi}_{2-1}$ is the phase difference between the first line of non-phase encoded k-space data and the second line of the non-phase encoded k-space data and is calculated based on:

$$\overline{\varphi}_{2-1} = \frac{\sum_{i=1}^{n} \varphi_i^{2-1}}{n},$$

where $\varphi_i^{2-1}$ is a phase difference between an $i^{th}$ data sampling point in the first line of non-phase encoded k-space data and an $i^{th}$ data sampling point in the second line of the non-phase encoded k-space data, and n is a number of sampling points in each line of non-phase encoded k-space data.

Further improvement of the present disclosure lies in that in the Step 3, the coarse estimated value is calculated by:

calculating the difference between the phase difference between the second line of non-phase-encoded k-space data and the third line of non-phase encoded space data and the phase difference between the first line of non-phase-encoded k-space data and the second line of non-phase encoded space data, to obtain the coarse estimated value $\Delta f_{coarse}$ of the main magnetic field frequency drift, and a calculation process is based on:

$$\Delta f_{coarse} = \frac{\overline{\varphi}_{3-2} - \overline{\varphi}_{2-1}}{2\pi \cdot \tau},$$

where $\tau$ is a blank interval between the moments $t_2$ and $t_3$, $\tau=(t_3-t_2)-(t_2-t_1)$, $\overline{\varphi}_{3-2}$ is the phase difference between the second line of non-phase encoded k-space data and the third line of non-phase encoded k-space data, and is calculated based on:

$$\overline{\varphi}_{3-2} = \frac{\sum_{i=1}^{n} \varphi_i^{3-2}}{n},$$

where $\varphi_i^{3-2}$ is a phase difference between the $i^{th}$ data sampling point in the second line of non-phase encoded k-space data and an $i^{th}$ data sampling point in the third line of non-phase encoded k-space data.

Further improvement of the present disclosure lies in that in the Step 4, the value of the main magnetic field frequency drift is determined by:

if $(\Delta f_{coarse} - \Delta f_{fine}) < f_{threshold}$, then selecting the fine estimated value as the value of the main magnetic field frequency drift; otherwise, selecting the coarse estimated value as the value of the main magnetic field frequency drift; wherein the threshold is $$f_{threshold} = \frac{1}{\tau}.$$

Further improvement of the present disclosure lies in that the flip angle in the Step 1 is preferably smaller than 10°.

Further improvement of the present disclosure lies in that the blank interval $\tau$ is 0.

Another object of the present disclosure is to provide a magnetic resonance CEST imaging device based on a frequency stabilization module, including a frequency stabilization module and a CEST imaging module;

the frequency stabilization module is configured to perform Step 1 through Step 5, Step 1: in the frequency stabilization module, exciting a target slice with a radio frequency pulse having a flip angle smaller than 90°, and collecting three lines of non-phase-encoded k-space data at three different moments $t_1$, $t_2$, and $t_3$, respectively, where $t_2-t_1 \leq t_3-t_2 < 2(t_2-t_1)$;

Step 2: obtaining a fine estimated value of a main magnetic field frequency drift by calculating a phase difference between a first line of non-phase-encoded k-space data and a second line of non-phase encoded k-space data;

Step 3: obtaining a coarse estimated value of the main magnetic field frequency drift by calculating a difference between a phase difference between the second line of non-phase encoded k-space data and a third line of non-phase encoded k-space data and the phase difference between the first line of non-phase-encoded k-space data and the second line of non-phase encoded k-space data;

Step 4: comparing a difference between the coarse estimated value and the fine estimated value of the main magnetic field frequency drift with a threshold, and if the difference between the coarse estimated value and the fine estimated value is smaller than the threshold, then selecting the fine estimated value as a value of the main magnetic field frequency drift; otherwise, selecting the coarse estimated value as the value of the main magnetic field frequency drift; and Step 5: adjusting a center frequency of the radio frequency pulse based on the value of the main magnetic field frequency drift, and then performing magnetic resonance CEST imaging based on the adjusted center frequency of the radio frequency pulse.

In the present disclosure, the magnetic resonance CEST imaging in the Step 5 can adopt conventional magnetic resonance CEST imaging. Generally, the conventional magnetic resonance CEST imaging sequence includes three modules: CEST saturation, spectral presaturation with inversion recovery fat suppression, and turbo spin echo acquisition.

Further improvement made to the above device in the present disclosure lies in that in the frequency stabilization module, the fine estimated value in the Step 2 is calculated by:

first, averaging phase differences between individual data sampling points in the first line of non-phase-encoded k-space data and individual data sampling points in the second line of non-phase-encoded k-space data to obtain the phase difference between the first line of non-phase-encoded k-space data and the second line of non-phase-encoded k-space data, and then calculating the fine estimated value $\Delta f_{fine}$ of the main magnetic field frequency drift based on a relationship between a phase and a frequency, and a calculation process is based on:

$$\Delta f_{fine} = \frac{\overline{\varphi}_{2-1}}{2\pi \cdot \Delta TE_{2-1}},$$

where $\Delta TE_{2-1}$ is an interval between the moments $t_1$ and $t_2$, and $\overline{\varphi}_{2-1}$ is the phase difference between the first line of non-phase encoded k-space data and the second line of the non-phase encoded k-space data and is calculated based on:

$$\overline{\varphi}_{2-1} = \frac{\sum_{i=1}^{n} \varphi_i^{2-1}}{n},$$

where $\varphi_i^{2-1}$ is a phase difference between an $i^{th}$ data sampling point in the first line of non-phase encoded k-space data and an $i^{th}$ data sampling point in the second line of the non-phase encoded k-space data, and n is a number of sampling points in each line of non-phase encoded k-space data.

Further improvement made to the above device in the present disclosure lies in that in the frequency stabilization module, in the Step 3, the coarse estimated value is calculated by:

calculating the difference between the phase difference between the second line of non-phase-encoded k-space data and the third line of non-phase encoded space data and the phase difference between the first line of non-phase-encoded k-space data and the second line of non-phase encoded space data, to obtain the coarse estimated value $\Delta f_{coarse}$ of the main magnetic field frequency drift, and a calculation process is based on:

$$\Delta f_{coarse} = \frac{\overline{\varphi}_{3-2} - \overline{\varphi}_{2-1}}{2\pi \cdot \tau},$$

where $\tau$ is a blank interval between the moments $t_2$ and $t_3$, $\tau=(t_3-t_2)-(t_2-t_1)$, and $\overline{\varphi}_{3-2}$ is the phase difference between the second line of non-phase encoded k-space data and the third line of non-phase encoded k-space data and is calculated based on:

$$\overline{\varphi}_{3-2} = \frac{\sum_{i=1}^{n} \varphi_i^{3-2}}{n},$$

where $\varphi_i^{3-2}$ is a phase difference between the $i^{th}$ data sampling point in the second line of non-phase encoded k-space data and an $i^{th}$ data sampling point in the third line of non-phase encoded k-space data.

Further improvement made to the above device in the present disclosure lies in that in the frequency stabilization module, the value of the main magnetic field frequency drift in the Step 4 is determined by:

if $(\Delta f_{coarse} - f_{fine}) < f_{threshold}$, then selecting the fine estimated value as the value of the main magnetic field frequency drift; otherwise, selecting the coarse estimated value as the value of the main magnetic field frequency drift; wherein the threshold is $$f_{threshold} = \frac{1}{\tau}.$$

Further improvement made to the above device in the present disclosure lies in that in the frequency stabilization module, the flip angle in the Step 1 is preferably smaller than 10°.

Further improvement made to the above device in the present disclosure lies in that the blank interval $\tau$ is 0.

Compared with the prior art, the present disclosure has the following beneficial effects. The present disclosure, by collecting three lines of non-phase-encoded k-space data in the frequency stabilization module and calculating the phase difference between lines of non-phase-encoded k-space data, obtains the coarse estimated value and the fine estimated value of the main magnetic field frequency drift through the relationship between the phase and the frequency, and removes an effect of the $2\pi$ periodicity of the phase by comparing the difference between the coarse estimated value and the fine estimated value of the main magnetic field frequency drift with the threshold, so as to obtain an accurate value of the main magnetic field frequency drift. The center frequency of the radio frequency pulse is then adjusted according to the calculation result of the main magnetic field frequency drift, which can not only effectively suppress fat signals but also correct the main magnetic field frequency drift in real time, to improve the performance of magnetic resonance CEST imaging and provide the reliability of precision of the subsequent quantitative analysis of CEST signals, which also makes the present disclosure have very important clinical application value.

DESCRIPTION OF EMBODIMENTS

Figure 1:
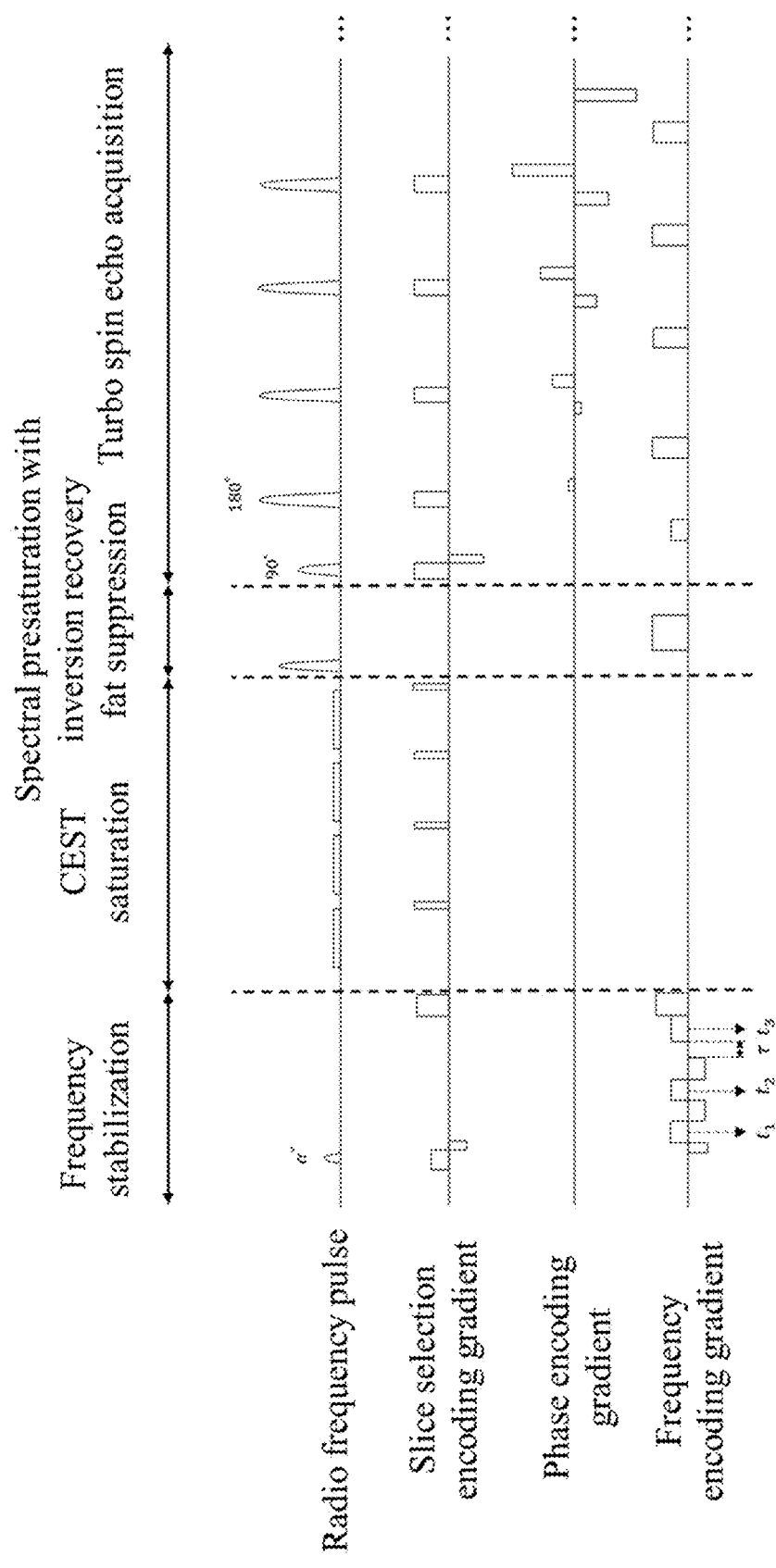
FIG. 1 is a block diagram of a magnetic resonance CEST imaging sequence based on a frequency stabilization module.

Referring to FIG. 1, a preferred embodiment of the present disclosure provides a magnetic resonance CEST imaging sequence based on a frequency stabilization module. The method includes the following steps.

At Step 1, a target slice is excited with a radio frequency pulse having a small flip angle smaller than 90° (preferably smaller than 10°), and three lines of non-phase-encoded k-space data are collected at moments $t_1$, $t_2$, and $t_3$, respectively, where the moments $t_1$, $t_2$, and $t_3$ need to satisfy: $t_2-t_1 < t_3-t_2 < 2(t_2-t_1)$. A blank interval between $t_2$ and $t_3$ is $\tau$, and $x=(t_3-t_2)-(t_2-t_1)$.

At Step 2, first, phase differences between individual data sampling points in the first line of non-phase-encoded k-space data and individual data sampling points in the second line of non-phase-encoded k-space data are averaged to obtain the phase difference between the first lines of non-phase-encoded k-space data and the second line of non-phase-encoded k-space data, and then a fine estimated value of main magnetic field frequency drift is calculated based on a relationship between a phase and a frequency and is calculated based on:

$$\overline{\varphi}_{2-1} = \frac{\sum_{i=1}^{n} \varphi_i^{2-1}}{n} \tag{1}$$

$$\Delta f_{fine} = \frac{\overline{\varphi}_{2-1}}{2\pi \cdot \Delta TE_{2-1}} \tag{2}$$

where $\varphi_i^{2-1}$ is a phase difference between the $i^{th}$ data sampling point in the first line of non-phase encoded k-space data and the $i^{th}$ data sampling point in the second line of the non-phase encoded k-space data, n is the number of sampling points in each line of non-phase encoded space data, $\overline{\varphi}_{2-1}$ is the phase difference between the first line of non-phase encoded k-space data and the second line of the non-phase encoded k-space data, $\Delta TE_{2-1}$ is an interval between the moments $t_1$ and $t_2$, and $\Delta f_{fine}$ is the fine estimated value of the main magnetic field frequency drift.

At Step 3, a difference between the phase difference between the second line of non-phase encoded k-space data and the third line of non-phase encoded k-space data and the phase difference between the first line of non-phase-encoded k-space data and the second line of non-phase encoded k-space data is calculated, and a coarse estimated value of the main magnetic field frequency drift is obtained. The calculation process is based on the following formulas.

$$\overline{\varphi}_{2-1} = 2\pi \cdot \Delta f_{coarse} \cdot \Delta TE_{2-1} \quad (3)$$

$$\overline{\varphi}_{3-2} = 2\pi \cdot \Delta f_{coarse} \cdot \Delta TE_{3-2} = 2\pi \cdot 2 f_{coarse} \cdot (\Delta TE_{2-1} + \tau) \quad (4)$$

The formula (3) is subtracted from the formula (4) and taking a difference to obtain:

$$\Delta f_{coarse} = \frac{\overline{\varphi}_{3-2} - \overline{\varphi}_{2-1}}{2\pi \cdot \tau} \quad (5)$$

where $\overline{\varphi}_{2-1}$ is the phase difference between the first line of non-phase encoded k-space data and the second line of the non-phase encoded k-space data, $\Delta TE_{2-1}$ is an interval between the moments $t_1$ and $t_2$, $\Delta TE_{3-2}$ is an interval between the moments $t_2$ and $t_3$, $\tau$ is a blank interval between the moments $t_2$ and $t_3$, $\Delta f_{coarse}$ is the coarse estimated value of the main magnetic field frequency drift, and $\overline{\varphi}_{3-2}$ is the phase difference between the second line of non-phase encoded k-space data and the third line of non-phase encoded k-space data is calculated similarly to $\overline{\varphi}_{2-1}$ as:

$$\overline{\varphi}_{3-2} = \frac{\sum_{i=1}^{n} \varphi_i^{3-2}}{n},$$

where $\varphi_i^{3-2}$ is a phase difference between the $i^{th}$ data sampling point in the second line of non-phase encoded k-space data and an $i^{th}$ data sampling point in the third line of non-phase encoded k-space data.

At Step 4, due to $2\pi$ periodicity of the phase, in order to remove an effect of the $2\pi$ periodicity of the phase, it is necessary to compare a difference between the coarse estimated value and the fine estimated value of the main magnetic field frequency drift with a threshold, and the threshold is a maximum value of the main magnetic field frequency drift in a fine estimation range. Details are as follows.

If $(\Delta f_{coarse} - \Delta f_{fine}) < f_{threshold}$, then the fine estimated value is selected as the value of the main magnetic field frequency drift, that is, $\Delta f = \Delta f_{fine}$; otherwise, the coarse estimated value is selected as the value of the main magnetic field frequency drift, that is, $\Delta f = \Delta f_{coarse}$.

A calculation process of the threshold $f_{threshold}$ is as follows:

$$f_{threshold} = \frac{(\overline{\varphi}_{2-1})_{max}}{2\pi \cdot \tau} = \frac{2\pi}{2\pi \cdot \tau} = \frac{1}{\tau} \quad (6)$$

where $\Delta f_{fine}$ is the fine estimated value of the main magnetic field frequency drift, $\Delta f_{coarse}$ is the coarse estimated value of the main magnetic field frequency drift, $f_{threshold}$ is the threshold, and $\Delta f$ is the value of the main magnetic field frequency drift.

At Step 5, a center frequency of the radio frequency pulse is adjusted according to the calculated value of the main magnetic field frequency drift, to ensure effective suppression of fat signals and correct the main magnetic field frequency drift in real time.

After completing the above Step 1 through Step 5, magnetic resonance CEST imaging can be performed according to the adjusted center frequency of the radio frequency pulse. The magnetic resonance CEST imaging here can adopt conventional magnetic resonance CEST imaging, and it will be briefly introduced since it is not a focus of the present disclosure. A conventional magnetic resonance CEST imaging sequence includes three modules, i.e., CEST saturation, spectral presaturation with inversion recovery fat suppression, and turbo spin echo acquisition:

(1) the CEST saturation module including four rectangular saturation pulses, each of the saturation pulses being immediately followed by one spoiler gradient;

(2) the spectral presaturation with inversion recovery fat suppression module including one radio frequency pulse having a flip angle greater than 90 degrees, the radio frequency pulse being followed by one spoiler gradient; and (3) the turbo spin echo acquisition module including one radio frequency pulse that excites a target slice, and the radio frequency pulse being followed by m refocusing radio frequency pulses; that is, m lines of k-space data are collected in each repetition period (m is an acceleration factor); when each of the refocusing radio frequency pulses is applied, slice selection gradient encoding is performed at the same time, then phase gradient encoding is performed, finally frequency gradient encoding is performed, and k-space data acquisition is performed while performing the frequency gradient encoding.

It can be seen that the magnetic resonance CEST imaging method based on the frequency stabilization module of the present disclosure calculates the main magnetic field frequency drift through collecting three lines of non-phase-encoded k-space data, and then adjusts the center frequency of the radio frequency pulse according to the value of the main magnetic field frequency drift, to correct the main magnetic field frequency drift in real time, thereby improving the performance of the magnetic resonance CEST imaging.

It should be noted that, the blank interval $\tau$ satisfies $\tau \geq 0$ according to its definition, and its actual value can also be 0. When $\tau = 0$, $f_{threshold} = \infty$, and in this case, the fine estimated value is selected as the value of the main magnetic field frequency drift, that is, $\Delta f = \Delta f_{fine}$, and it is not necessary to calculate the coarse estimated value.

Corresponding to the imaging sequence above, a magnetic resonance CEST imaging device based on a frequency stabilization module can also be provided, and the device includes a frequency stabilization module and a CEST imaging module. The frequency stabilization module is configured to perform Step 1 through Step 5, to correct the main magnetic field frequency drift and ensure effective suppression of fat signals. The CEST imaging module is configured to be responsible for performing conventional magnetic resonance CEST imaging based on the adjusted center frequency of the radio frequency pulse.

Those skilled in the art should understand that respective modules and functions involved in the present disclosure can be completed by circuits, other hardware, or executable program codes, as long as the corresponding function can be implemented. If codes are used to implement the corresponding function, the codes can be stored in a storage device and executed by corresponding elements in a computing device. The implementation of the present disclosure is not limited to any particular combination of hardware and software. Each hardware model in the present disclosure can be a commercially available product and can be selected according to actual user requirements. Without doubt, in the magnetic resonance CEST imaging sequence and device, it is also necessary to cooperate with other necessary hardware or software, which will not be repeated herein.

The specific technical effects are illustrated below based on the methods above in combination with the embodiments, so that those skilled in the art can better understand the essence of the present disclosure.

Embodiment

The above magnetic resonance CEST imaging sequence based on the frequency stabilization module was respectively tested in magnetic resonance CEST imaging experiments of a water phantom and of 26 tested brains, and the results are compared with results of the conventional magnetic resonance CEST imaging sequence, to which the frequency stabilization module is not applied, respectively tested in magnetic resonance CEST imaging experiments of the water phantom and of the tested brains. For specific methods, reference can be made to the Step 1 through Step 5, which will not be repeated herein, and hereafter only specific parameters are introduced in the following. In this embodiment, the target slice is excited by a radio frequency pulse having a 3-degree flip angle, and three lines of non-phase-encoded k-space data are collected at moments $t_1=2.54$ ms, $t_2=5.12$ ms, and $t_3=8.33$ ms, where the blank interval between $t_2$ and $t_3$ is $\tau=0.64$ ms. The number of the sampling points of each line of the non-phase encoded space data is n=128. $f_{threshold}=387.60$ Hz.

In the present embodiment, the three modules of the conventional magnetic resonance CEST imaging sequence are as follows:

(1) the CEST saturation module: this module includes four rectangular saturation pulses, and each of the saturation pulses has a duration of 200 ms and an amplitude of 2 μT; each of the saturation pulses is followed by one spoiler gradient, and the spoiler gradient has a duration of 10 ms and intensity of 10 mT/m;

(2) the spectral presaturation with inversion recovery fat suppression module: this module includes one radio frequency pulse having a 110-degree flip angle, and the radio frequency is followed by one spoiler gradient;

(3) the turbo spin echo acquisition module: this module includes one radio frequency pulse having a 90-degree flip angle, and the 90-degree radio frequency pulse is followed by 42 180-degree refocused radio frequency pulses; that is, 42 lines of k-space data are collected in each repetition period (the acceleration factor is 42); when each of the 180-degree refocusing radio frequency pulse is applied, slice selection gradient encoding is performed at the same time, then phase gradient encoding is performed, finally frequency gradient encoding is performed, and k-space data acquisition is performed while performing the frequency gradient encoding.

Figure 2:
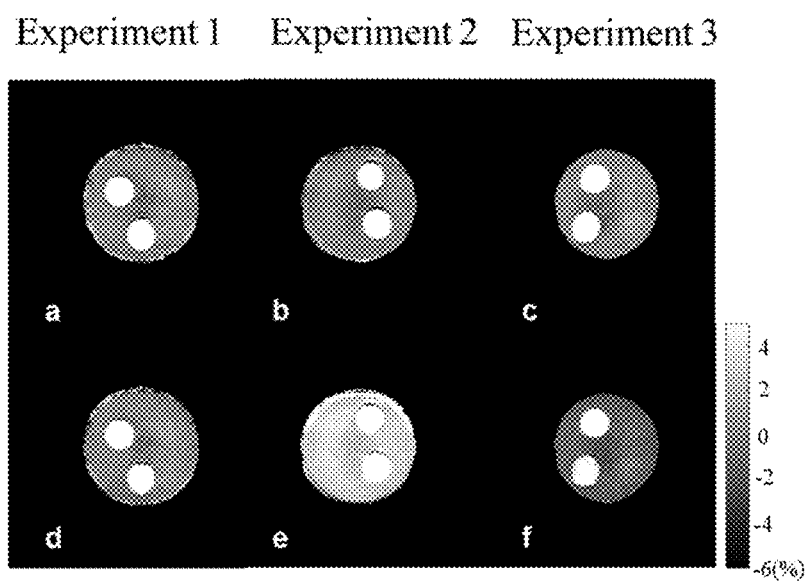
FIG. 2 illustrates comparison of CEST images respectively obtained through a magnetic resonance CEST imaging sequence based on a frequency stabilization module and through a conventional magnetic resonance CEST imaging sequence without a frequency stabilization module when scanning a water phantom experiment.
Figure 3:
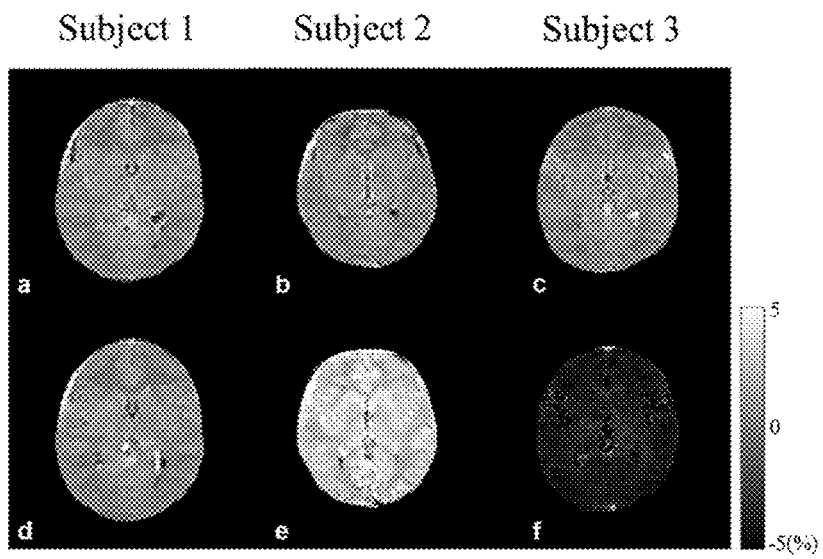
FIG. 3 illustrates comparison of CEST images respectively obtained through a magnetic resonance CEST imaging sequence based on a frequency stabilization module and through a conventional magnetic resonance CEST imaging sequence without a frequency stabilization module when scanning a human brain.
Figure 4:
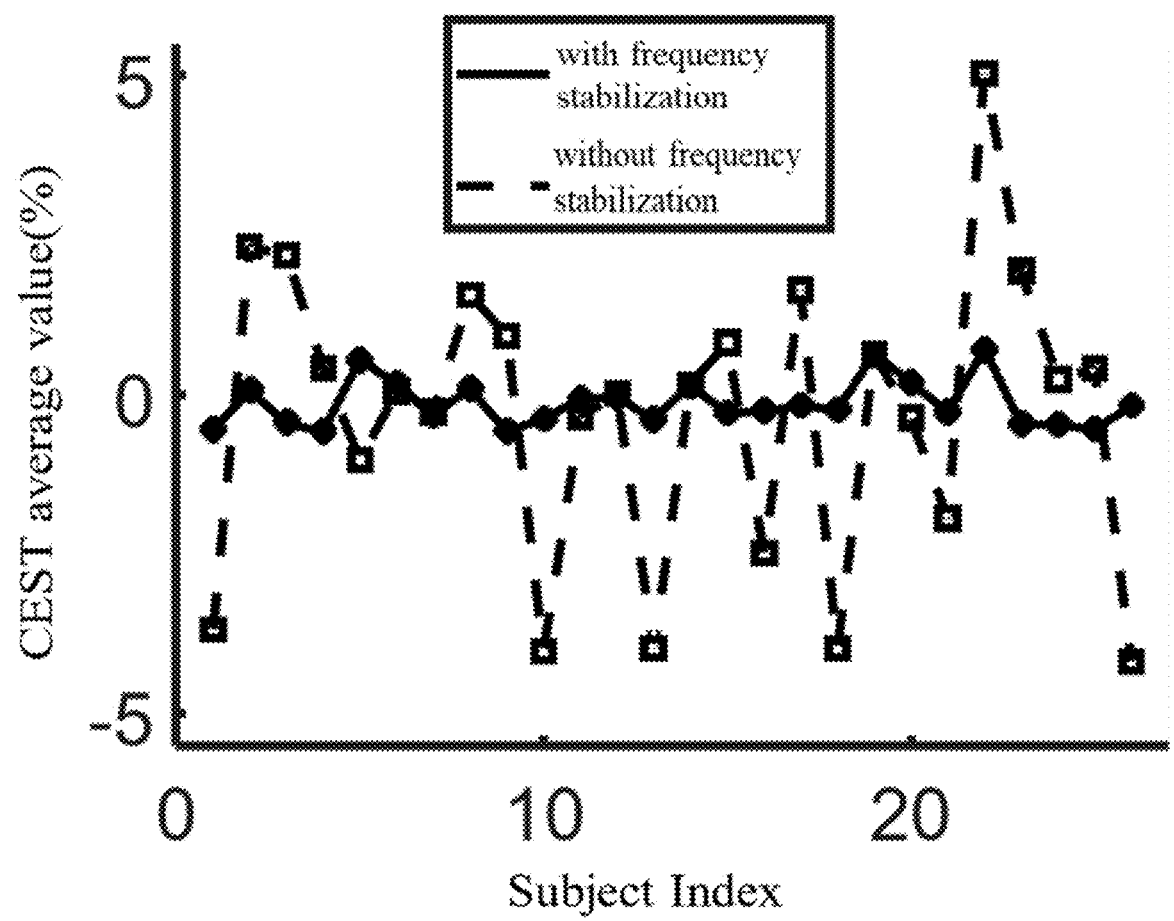
FIG. 4 illustrates comparison of average CEST values of regions of interest on CEST images respectively obtained through a magnetic resonance CEST imaging sequence based on a frequency stabilization module and through a conventional magnetic resonance CEST imaging sequence without a frequency stabilization module when scanning a human brain.

The comparative experiment results in this embodiment are shown in FIG. 2, FIG. 3, and FIG. 4.

As can be seen from FIG. 2 and FIG. 3, whether in the water phantom or in the magnetic resonance CEST imaging experiment of the tested brain, the CEST image quality of the magnetic resonance CEST imaging sequence based on the frequency stabilization module is very good; while on the CEST image of the conventional magnetic resonance CEST imaging sequence to which the frequency stabilization module is not applied, there are a lot of image artifacts caused by the main magnetic field frequency drift, resulting in that the image quality is relatively poor and the CEST image intensity changes drastically, which shows the effectiveness of the present disclosure.

It can be seen from FIG. 4 that the average CEST value of a region of interest of the CEST image of the magnetic resonance CEST imaging sequence based on the frequency stabilization module is very stable, while the average CEST value of a region of interest of the CEST image of an experiment in which the human brain is scanned by the conventional magnetic resonance CEST imaging sequence to which the frequency stabilization module is not applied has a relatively large fluctuation, which further proves the effectiveness of the present disclosure.

It should be noted that the embodiment described above is only a preferred solution of the present disclosure, but it is not intended to limit the present disclosure. Those of ordinary skills in the related art can make various changes and modifications without departing from the spirit and scope of the present disclosure. Therefore, any technical solution obtained by adopting an equivalent replacement or equivalent transformation falls within the protection scope of the present disclosure.

What is claimed is:

1. A magnetic resonance CEST imaging sequence based on a frequency stabilization module, comprising:

Step 1: in the frequency stabilization module, exciting a target slice with a radio frequency pulse having a flip angle smaller than 90°, and collecting three lines of non-phase-encoded k-space data at three different moments $t_1$, $t_2$, and $t_3$, respectively, where $t_2-t_1<t_3-t_2<2(t_2-t_1)$;

Step 2: obtaining a fine estimated value of a main magnetic field frequency drift by calculating a phase difference between a first line of non-phase-encoded k-space data and a second line of non-phase encoded k-space data, wherein the fine estimated value is calculated by:

first, averaging phase differences between individual data sampling points in the first line of non-phase-encoded k-space data and individual data sampling points in the second line of non-phase-encoded k-space data to obtain the phase difference between the first line of non-phase-encoded k-space data and the second line of non-phase-encoded k-space data, and then calculating the fine estimated value $\Delta f_{fine}$ of the main magnetic field frequency drift based on a relationship between a phase and a frequency, and a calculation process is based on:

$$\Delta f_{fine} = \frac{\overline{\varphi}_{2-1}}{2\pi \cdot \Delta TE_{2-1}},$$

where $\Delta TE_{2-1}$ is an interval between the moments $t_1$ and $t_2$, and $\overline{\varphi}_{2-1}$ is the phase difference between the first line of non-phase encoded k-space data and the second line of the non-phase encoded k-space data and is calculated based on:

$$\overline{\varphi}_{2-1} = \frac{\sum_{i=1}^{n} \varphi_i^{2-1}}{n},$$

where $\varphi_i^{2-1}$ is a phase difference between an $i^{th}$ data sampling point in the first line of non-phase encoded k-space data and an $i^{th}$ data sampling point in the second line of the non-phase encoded k-space data, and n is a number of sampling points in each line of non-phase encoded k-space data;

Step 3: obtaining a coarse estimated value of the main magnetic field frequency drift by calculating a difference between a phase difference between the second line of non-phase encoded k-space data and a third line of non-phase encoded k-space data and the phase difference between the first line of non-phase-encoded k-space data and the second line of non-phase encoded k-space data, wherein the coarse estimated value is calculated by:

calculating the difference between the phase difference between the second line of non-phase-encoded k-space data and the third line of non-phase encoded space data and the phase difference between the first line of non-phase-encoded k-space data and the second line of non-phase encoded space data, to obtain the coarse estimated value $\Delta f_{coarse}$ of the main magnetic field frequency drift, and a calculation process is based on:

$$\Delta f_{coarse} = \frac{\bar{\varphi}_{3-2} - \bar{\varphi}_{2-1}}{2\pi \cdot \tau},$$

where $\tau$ is a blank interval between the moments $t_2$ and $t_3$, $\tau=(t_3-t_2)-(t_2-t_1)$, $\bar{\varphi}_{3-2}$ is the phase difference between the second line of non-phase encoded k-space data and the third line of non-phase encoded k-space data and is calculated based on:

$$\bar{\varphi}_{3-2} = \frac{\sum_{i=1}^{n} \varphi_i^{3-2}}{n},$$

where $\varphi_i^{3-2}$ is a phase difference between the $i^{th}$ data sampling point in the second line of non-phase encoded k-space data and an $i^{th}$ data sampling point in the third line of non-phase encoded k-space data;

Step 4: comparing a difference between the coarse estimated value and the fine estimated value with a threshold, and if the difference between the coarse estimated value and the fine estimated value is smaller than the threshold, then selecting the fine estimated value as a value of the main magnetic field frequency drift; otherwise, selecting the coarse estimated value as the value of the main magnetic field frequency drift; wherein the value of the main magnetic field frequency drift is determined by:

if $(\Delta f_{coarse} - \Delta f_{fine}) < f_{threshold}$, then selecting the fine estimated value as the value of the main magnetic field frequency drift; otherwise, selecting the coarse estimated value as the value of the main magnetic field frequency drift; wherein the threshold is $$f_{threshold} = \frac{1}{\tau};$$

and

Step 5: adjusting a center frequency of the radio frequency pulse based on the value of the main magnetic field frequency drift, and then performing magnetic resonance CEST imaging based on the adjusted center frequency of the radio frequency pulse.

2. The magnetic resonance CEST imaging sequence based on the frequency stabilization module according to claim 1, wherein the flip angle in the Step 1 is smaller than 10°.

3. A magnetic resonance CEST imaging device based on a frequency stabilization module, comprising a frequency stabilization module and a CEST imaging module;

wherein the frequency stabilization module is configured to perform Step 1 through Step 5, Step 1: in the frequency stabilization module, exciting a target slice with a radio frequency pulse having a flip angle smaller than 90°, and collecting three lines of non-phase-encoded k-space data at three different moments $t_1$, $t_2$, and $t_3$, respectively, where $t_2-t_1 < t_3-t_2 < 2(t_2-t_1)$;

Step 2: obtaining a fine estimated value of a main magnetic field frequency drift by calculating a phase difference between a first line of non-phase-encoded k-space data and a second line of non-phase encoded k-space data;

Step 3: obtaining a coarse estimated value of the main magnetic field frequency drift by calculating a difference between a phase difference between the second line of non-phase encoded k-space data and a third line of non-phase encoded k-space data and the phase difference between the first line of non-phase-encoded k-space data and the second line of non-phase encoded k-space data;

Step 4: comparing a difference between the coarse estimated value and the fine estimated value with a threshold, and if the difference between the coarse estimated value and the fine estimated value is smaller than the threshold, then selecting the fine estimated value as a value of the main magnetic field frequency drift; otherwise, selecting the coarse estimated value as the value of the main magnetic field frequency drift; and Step 5: adjusting a center frequency of the radio frequency pulse based on the value of the main magnetic field frequency drift, and then performing magnetic resonance CEST imaging based on the adjusted center frequency of the radio frequency pulse;

wherein in the frequency stabilization module, the fine estimated value in the Step 2 is calculated by:

first, averaging phase differences between individual data sampling points in the first line of non-phase-encoded k-space data and individual data sampling points in the second line of non-phase-encoded k-space data to obtain the phase difference between the first line of non-phase-encoded k-space data and the second line of non-phase-encoded k-space data, and then calculating the fine estimated value $\Delta f_{fine}$ of the main magnetic field frequency drift based on a relationship between a phase and a frequency, and a calculation process is based on:

$$\Delta f_{fine} = \frac{\bar{\varphi}_{2-1}}{2\pi \cdot \Delta TE_{2-1}},$$

where $\Delta TE_{2-1}$ is an interval between the moments $t_1$ and $t_2$, and $\bar{\varphi}_{2-1}$ is the phase difference between the first line of non-phase encoded k-space data and the second line of the non-phase encoded k-space data and is calculated based on:

$$\overline{\varphi}_{2-1} = \frac{\sum_{i=1}^{n} \varphi_i^{2-1}}{n},$$

where $\varphi_i^{2-1}$ is a phase difference between an $i^{th}$ data sampling point in the first line of non-phase encoded k-space data and an $i^{th}$ data sampling point in the second line of the non-phase encoded k-space data, and n is a number of sampling points in each line of non-phase encoded space data;

wherein in the frequency stabilization module, the coarse estimated value in the Step 3 is calculated by:

calculating the difference between the phase difference between the second line of non-phase-encoded k-space data and the third line of non-phase encoded space data and the phase difference between the first line of non-phase-encoded k-space data and the second line of non-phase encoded space data, to obtain the coarse estimated value $\Delta f_{coarse}$ of the main magnetic field frequency drift, and a calculation process is based on:

$$\Delta f_{coarse} = \frac{\overline{\varphi}_{3-2} - \overline{\varphi}_{2-1}}{2\pi \cdot \tau},$$

where $\tau$ is a blank interval between the moments $t_2$ and $t_3$, $\tau = (t_3 - t_2) - (t_2 - t_1)$, and $\overline{\varphi}_{3-2}$ is the phase difference between the second line of non-phase encoded k-space data and the third line of non-phase encoded k-space data and is calculated based on:

$$\overline{\varphi}_{3-2} = \frac{\sum_{i=1}^{n} \varphi_i^{3-2}}{n},$$

where $\varphi_i^{3-2}$ is a phase difference between the $i^{th}$ data sampling point in the second line of non-phase encoded k-space data and an $i^{th}$ data sampling point in the third line of non-phase encoded k-space data;

wherein in the frequency stabilization module, the value of the main magnetic field frequency drift in the Step 4 is determined by:

if $(\Delta f_{coarse} - \Delta f_{fine}) < f_{threshold}$, then selecting the fine estimated value as the value of the main magnetic field frequency drift; otherwise, selecting the coarse estimated value as the value of the main magnetic field frequency drift; wherein the threshold is $$f_{threshold} = \frac{1}{\tau}.$$

4. The magnetic resonance CEST imaging device based on the frequency stabilization module according to claim 3, wherein in the frequency stabilization module, the flip angle in the Step 1 is smaller than 10°.

\* \* \* \* \*